TEMPERATURE COMPENSATION FOR LOGIC CIRCUITS

Filed April 29, 1970

INVENTORS
RICHARD W. BRYANT
GEORGE K. TU
BY Amster & Rothstein
ATTORNEYS

United States Patent Office 3,716,722
Patented Feb. 13, 1973

3,716,722

TEMPERATURE COMPENSATION FOR LOGIC CIRCUITS

Richard W. Bryant, Poughkeepsie, and George K. Tu, Wappingers Falls, N.Y., assignors to Cogar Corporation, Wappingers Falls, N.Y.

Filed Apr. 29, 1970, Ser. No. 32,922
Int. Cl. H03f *1/30;* H03k *19/30, 19/34*
U.S. Cl. 307—215 7 Claims

ABSTRACT OF THE DISCLOSURE

A temperature compensation circuit for an emitter-coupled circuit. Instead of using a fixed reference voltage, the reference voltage is derived from various active devices such that it varies with temperature in the same manner as the input signal levels vary with temperature. By causing the reference voltage to change in accordance with changes in temperature, it is possible to design circuits which have small signal swings yet interface with each other, and are capable of high switching speeds over relatively large temperature ranges.

TEMPERATURE COMPENSATION FOR LOGIC CIRCUITS

This invention relates to temperature compensation, and more particularly to temperature compensation for emitter-coupled logic (ECL) integrated circuits.

Logic circuits must often be designed to operate over a relatively wide range of temperatures. Temperature variations can affect the operation of a semiconductor circuit, and for this reason various approaches have been taken to insure the proper operation of a logic circuit over the entire temperature range for which it is designed to operate. But the techniques which have been utilized in the prior art have various shortcomings. For example, they result in a waste of power or they decrease the speed of operation.

It is a general object of our invention to provide improved temperature compensation for logic circuits.

It is a more particular object of our invention to provide temperature compensation for ECL integrated circuits.

In an ECL current switch, the emitters of two transistors are coupled together and connected through a resistor to a potential source (typically, the resistor is large in magnitude and thus serves as a current source). The base of one transistor is connected to a reference voltage and the input signal is applied to the base of the other transistor. Depending on whether the input signal is above or below the reference voltage, one or the other of the two transistors conducts. Complementary output signals can be derived at the collectors of the two transistors.

If the reference voltage is fixed, but the two levels of the input signal vary with temperature, it is possible for both levels of the input to be above or below the reference voltage. In such a case, changes in the input signal level have no effect on the complementary outputs of the current switch.

To prevent this from happening, it is possible, as has been done in the prior art, to provide for larger swings in the input signal. By separating the two input levels sufficiently, it is possible for them to straddle the reference voltage at all temperatures within the design range. However, by providing for larger swings in the input signal, the speed of operation is reduced and the circuit dissipates more power.

In accordance with the principles of our invention, the design emphasis is not to control the input signal levels as desecribed above. Instead, the reference voltage is caused to change with temperature in the same direction as that in which the two input signal levels change. In other words, the two input signal levels still straddle the reference voltage at all temperatures within the design range even though they change with temperature. The temperature compensation of our invention in effect causes the reference voltage to track the threshold voltage (the threshold voltage being the center voltage between the two input signal levels) as the threshold voltage varies with temperature.

It is a feature of our invention to vary the reference voltage used for a switching circuit so that it tracks the two levels of an input signal as they change with temperature.

Further objects, features and advantages of our invention will become apparent upon a consideration of the following detailed description in conjunction with the drawing in which.

Figure 1:
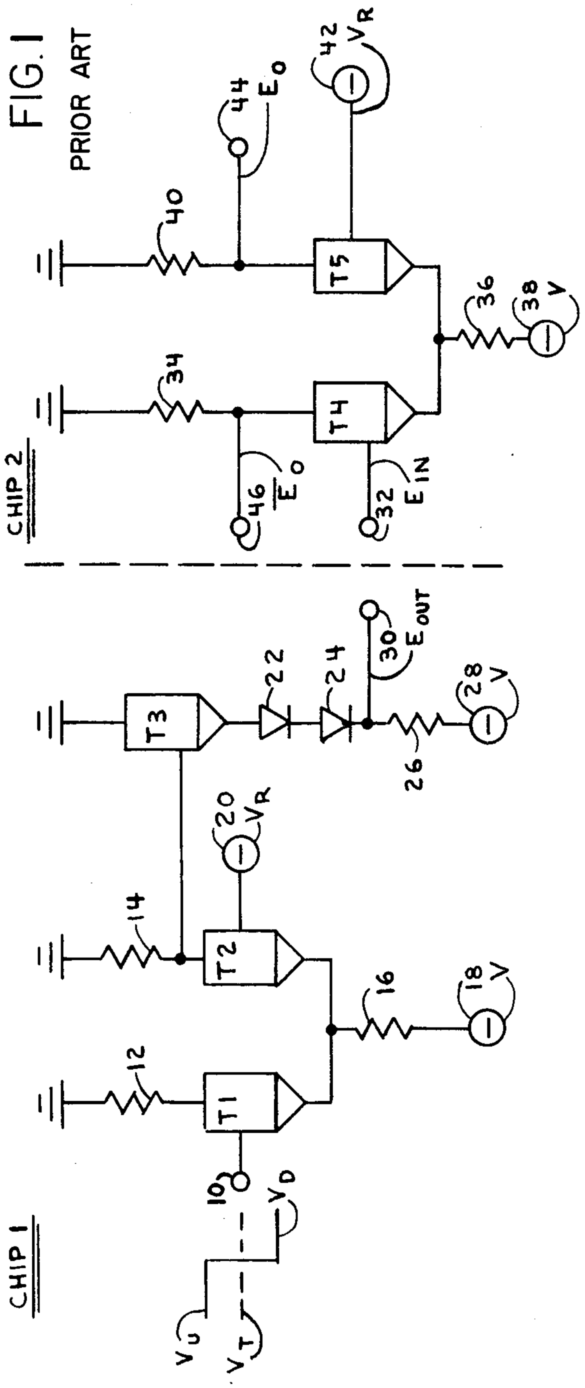
FIG.1 PRIOR ART
FIG. 1 depicts a typical prior art circuit.

FIG. 1 depicts two chips. Although the invention is applicable to ECL circuits all on the same chip, as will be described below, the problem toward which the invention is directed is more severe in the case of different chips connected to each other. On chip 1 in FIG. 1, transistors T1, T2 form a current switch, the emitters of the two transistors being extended through resistor 16 to negative potential source 18 of magnitude V. The collectors of the two transistors are extended through respective resistors 12, 14 to ground. The input signal is applied to terminal 10, connected to the base of transistor T1. The input signal varies between upper and lower levels $V_U$ and $V_D$. The threshold level $V_T$ is centered between the upper and lower levels.

A reference source 20 of magnitude $V_R$ (equal to $V_T$) is connected to the base of transistor T2. (The reference voltage is typically derived from the source of magnitude V through a voltage divider network; the effect is the same as using a separate reference source.) The collector of the transistor, the output of the current switch, is connected to the base of transistor T3. The emitter of transistor T3 is connected through diodes 22, 24 and resistor 26 to negative source 28 of magnitude V. The output signal $E_{out}$ at terminal 30 is taken from the junction of diode 24 and resistor 26.

If the input signal is at level $V_U$, transistor T1 conducts and the voltage developed across resistor 16 turns off transistor T². (In the case of a large resistor 16, which, effectively functions as a current source, all of the current of the source flow through transistor T1 and transistor T2 thus does not conduct.) The collector of transistor T2 rises in potential and and increases the forward bias across the base-emitter junction of transistor T3. The transistor current is at its maximum design level and the voltage at terminal 30 is similarly at a maximum. On the other hand, if the input signal is at the lower level $V_D$, transistor T2 conducts rather than transistor T1, the collector of transistor T2 is at a more negative potential, and the current through transistor T3 is at the minimum design level. In such a case, the output signal at terminal 30 is at a minimum.

Ideally, the magnitude of reference voltage $V_R$ is the same as threshold voltage $V_T$. In such a case, the upper input signal level causes transistor T1 to conduct and transistor T2 to turn off, while the lower input level causes transistor T2 to conduct and transistor T1 to turn off. The function of diodes 22, 24 is to lower the signal which appears at terminal 30. When transistor T1 conducts, the emitter current of transistor T3 flows through transistor T3, the two diodes and resistor 26. Were the two diodes not included, when the input signal would be at the upper level $V_U$, the output signal at terminal 30 would be only slightly lower than ground. To make the output signal at terminal 30 compatible with another current switch (on chip 2) to which it is fed, the upper level (and therefore the lower level as well) at the output is lowered by the drops across the two diodes.

Since the magnitude of resistor 14 is typically quite low, when transistor T3 conducts, the output at terminal 30 is approximately equal to the drops across diodes 22 and 24 and the base-emitter junction of transistor T3. Typically, the temperature coefficient of each of the two diodes and the base-emitter junction of the transistor (which in effect is also a diode) is approximately −2 mv./° C. Thus, the temperature coefficient for the three elements in series is approximately −6 mv./° C. In the case of a system designed to operate over a temperature range of 90° C., it is apparent that the signal (at either level) at terminal 30 can vary by as much as 540 mv. as the temperature of the circuit varies. The difference between levels $V_U$ and $V_D$ at the input is typically less than one volt. If the voltage swing at terminal 30 is used to drive a succeeding current switch, it is apparent that a change in $E_{out}$ by as much as 540 mv. as the result of a temperature change may cause both levels at terminal 30 to be above (or below) the reference voltage which controls the switching of the succeeding current switch. In such a case, the output of this succeeding current switch does not change in accordance with the input signal initially applied at terminal 10.

Such a succeeding current switch is shown in FIG. 1 as being contained on chip 2. Input terminal 32 is connected to output terminal 30 on the first chip via some external conductor. (Obviously, the same problem is inherent in the case of a succeeding current switch contained on the same chip, although as will be described below, it is more severe in the case of different chips.) The base of transistor T5 is connected to a voltage source 42 of magnitude $V_R$. The input signal ($E_{in}$) applied to the base of transistor T4 is the same as the output signal $E_{out}$ derived by the circuit shown on chip 1. Since the emitters of transistors T4, T5 are coupled through resistor 36 to potential source 38, and the two collectors are connected through respective resistors 34, 40 to ground, it is apparent that complementary output signals $E_O$ and $\overline{E}_O$ appear on output terminals 44, 46.

If the input signal at terminal 32 is high, corresponding to upper level $V_U$ at terminal 10, the $E_O$ signal is similarly high and the $\overline{E}_O$ signal is low. On the other hand, if the input signal at terminal 10 is at level $V_D$, the $\overline{E}_O$ signal is high and the $E_O$ signal is low. This is true, however, only if the output signal at terminal 30 (the input signal at terminal 32) switches between two levels which are above and below reference level $V_R$. If the temperature of the circuit is too high, the drops across the base-emitter junction of transistor T3 and diodes 22 and 24 are significantly reduced. In such a case, both signal levels at terminal 30 are raised. One of the advantages of an ECL circuit is that because none of the transistors saturate, the circuit can operate at a high speed. But too high a potential at terminal 30 for the upper level can result in the saturation of transistor T4. As for the lower level, if the drops across the base-emitter junction of transistor T3 and diodes 22 and 24 are so low as the result of a temperature increase that the potential at terminal 30 actually rises above level $V_T$ ($V_R$), thelower level at terminal 32 may be above the reference voltage of source 42, and there will be no change in the complementary outputs $E_O$ and $\overline{E}_O$. It is possible to design the circuit such that the lower level input at terminal 10 causes transistor T3 to cease conducting altogether. In such a case, the output potential at terminal 30 would be clamped to the negative potential of source 28. However, while this would insure that the lower output level would be below the reference voltage of source 42, the output voltage swing at terminal 30 would be much larger than it would otherwise have to be, resulting in increased power dissipation. Also, this would not lower the "too-high" upper level at terminal 30.

Various techniques have been proposed in the prior art to increase the temperature range over which an ECL circuit can be operated. One technique is to omit diodes 22 and 24 (or however many diodes are used to decrease both levels at terminal 30 in order that the output signal at this terminal be compatible with a succeeding current switch) which gave rise to the problem in the first place. If this is done, however, it is apparent that the reference voltage of potential source 42 must be increased in order that it fall between the two possible signal levels at terminal 30, and the upper level at terminal 30 is closer to ground than it otherwise would be. There is thus less of a possible up-swing at terminals 44 and 46. It is also possible to increase the voltage swing at terminal 30, by a judicious choice of impedance magnitudes for the circuit on chip 1 (which would insure that even at increased temperatures the lower level is above $V_R$). But this results in greater power dissipation and reduced speed.

It is also apparent why the problem is more severe in the case of current switches contained on different chips. Depending on how the chips were fabricated, it is possible for the diode drops (and the base-emitter drop of transistor T3) to each be up to 50 mv. greater on one chip than on another. Thus, it is possible for the signal at terminal 30 to vary by as much as 150 mv. in the case of two chips containing the same circuit. This difference exists even before temperature complications. If either chip is to feed the circuit on chip 2, it is apparent that temperature-caused level changes must be reduced even further.

Figure 2:
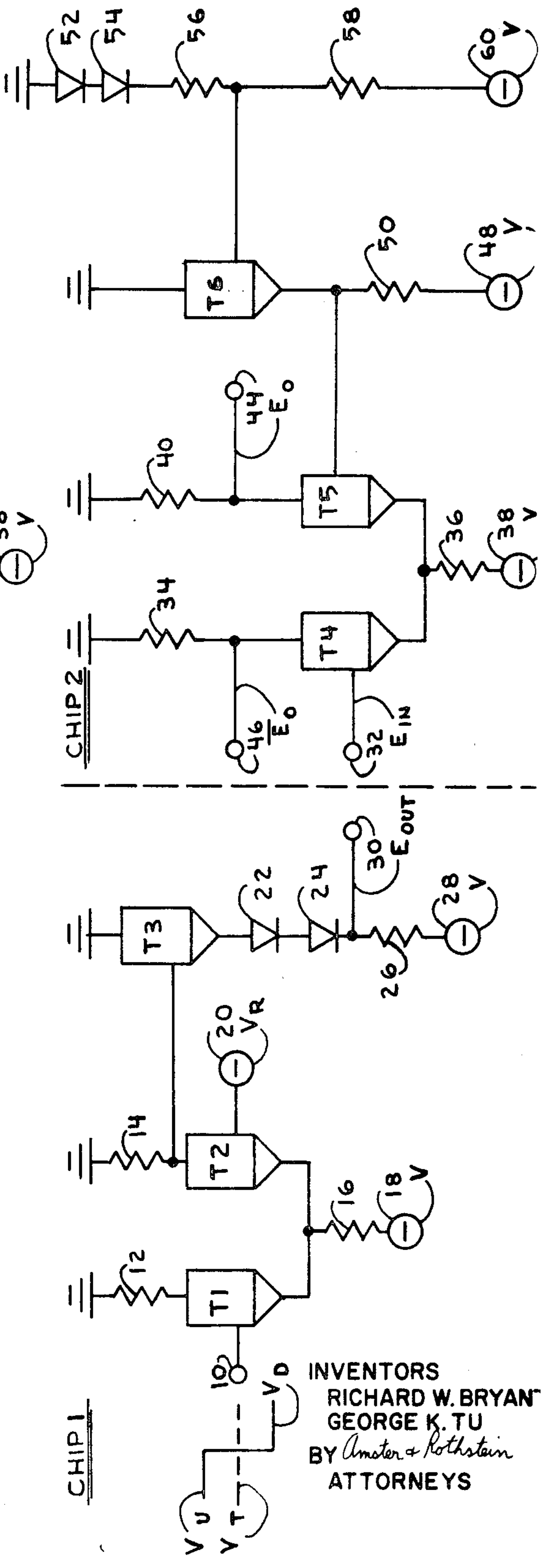
FIG. 2 depicts the illustrative embodiment of our invention.

In the illustrative embodiment of the invention shown in FIG. 2, voltage reference source 42 is replaced by two diodes 52, 54, resistors 56, 58, transistor T6 and resistor 50. This arrangement causes the reference voltage applied to the base of transistor T5 to increase with increasing temperature. Instead of trying to prevent variations in the signal levels at terminal 30, the signal levels are permitted to change with temperature. But what is done is to cause the reference voltage at the base of transistor T5 to change in the same direction. In such a case, the upper level at terminal 30 is always greater than the reference voltage at the base of transistor T5 while the lower level is always below it, no matter how the two levels change with temperature. (It is to be understood that if a similar problem exists on chip 1 itself, that is, if levels $V_U$ and $V_D$ change with temperature, then instead of using a fixed reference voltage source 20, it is possible to use another temperature dependent source. The temperature-dependent reference voltage can be used wherever the two signal levels at one input of a current switch, or comparator, change with temperature relative to the reference voltage applied to the other input of the switch.)

Current flows from ground through diodes 52, 54, and resistors 56, 58 to negative source 60. The base of transistor T6 is connected to the junctions of resistors 56 and 58, the base-emitter junction of the transistor is forward-biased and current flows from ground through the transistor and resistor 50 to negative source 48. The potential at the emitter of the transistor serves as the reference voltage for transistor T5. The reference voltage is equal to the sum of the voltage drops across diodes 52 and 54, resistor 56 and the base-emitter junction of transistor T6.

Any change in temperature affects the voltage drops across the two diodes and the base-emitter junction. Due to the voltage divide rrelationship of resistors 56 and 58, the change in the voltage at the base of transistor T5 equals the change in the base-emitter voltage drop of transistor T6, plus the sum of the diode voltage-drop changes multiplied by the ratio of the magnitude of resistor 58 to the sum of the magnitudes of resistors 56 and 58. If resistor 58 is much larger in magnitude than resistor 56, then to a good approximation the reference voltage varies as the sum of the changes in the voltage varies as the sum of the changes in the voltage drops across the two diodes and the base-emitter junction of the transistor. Referring to chip 1, it will be recalled that the signal at terminal 30 varies with temperature in accordance with variations in the potential drops across diodes 22 and 24 and the base-emitter junction of transistor T3. It is apparent that the reference potential at the base of transistor T5 varies in precisely the same way—it changes in accordance with the sum of the changes in drops across two diodes and a base-emitter junction. Since the two chips are generally at roughly the same temperature in any system in which they are interconnected, it is apparent that the two signal levels at terminal 32, while they may change with temperature, change in the same direction and to the same extent as the reference voltage coupled to the base of transistor T5. The close matching between the circuits allows them to be operated over a wide temperature range, while at the same time allowing small signal swings and high switching speeds.

The number of diodes used in the temperature compensation circuit is of course dependent on the number of diodes (such as 22 and 24) used to drop the signal level at terminal 30. In general, the temperature compensation circuit for deriving the reference voltage for any current switch is designed to have the same number of active elements as the output state of the preceding current switch in order that temperature-induced voltage variations be the same in all circuits. It is possible in the circuit of FIG. 2 to use three diodes, rather than two diodes and a transistor, in the temperature compensation circuit since the voltage drop across the third diode will generally be the same as the drop across the base-emitter junction of transistor T6. However, it is preferable to use a transistor rather than a third diode because of the current amplication provided by the transistor. The reference voltage at the emitter of transistor T6 can be coupled to many current switches. The use of the transistor permits fan-out so that the same compensation circuit can be used for a number of current switches.

Although the invention has been described with reference to a particular embodiment, it is to be understood that this embodiment is merely illustrative of the application of the principles of the invention. Numerous modifications may be made therein and other arrangements may be devised without departing from the spirit and scope of the invention.

What we claim is:

1. A logic circuit comprising means for deriving an input signal which varies between two discrete levels, said input signal deriving means including at least one active element, temperature variations in which control both of said discrete levels to change in the same direction with a change in temperature; a switching circuit having two input terminals and at least one output terminal; means for coupling said input signal to one of said input terminals such that the signal developed by said switching circuit at said output terminal is at one of two levels dependent upon the relative magnitudes of the signals at said two input terminals; and means for deriving a reference voltage for application to said second input terminal which changes with temperature in the same direction as said two discrete input signal levels, said input signal deriving means and said reference voltage deriving means each having the same number of active elements arranged such that the change in potential drops across the active elements in said input signal derivate means and the change in potential drops across the active elements in said reference voltage deriving means are approximately equal for the same change in temperature, said reference voltage deriving means includes a source of potential, and at least one diode and one resistor connected in series across said source of potential, said reference voltage deriving means further includes a transistor having a base-emitter junction connected between the said second input terminal and said series-connected resistor and diode.

2. A logic circuit in accordance with claim 1 wherein said input signal deriving means includes at least one transistor and at least one diode connected in series with the base-emitter junction of said transistor, said series-connected transistor and diode being coupled to said one input terminal.

3. A logic circuit in accordance with claim 1 wherein said switching circuit includes two transistors, each having emitter, base and collector terminals, means for interconnecting the emitter terminals of said two transistors, said base terminals being said two input terminals and one of said collector terminals being said at least one output terminal.

4. A circuit comprising means for deriving an input signal which varies between two levels, said input signal deriving means including at least one active element, temperature variations in which control both of said two levels to change in the same direction with a change in temperature; comparator means having two input terminals and at least one output terminal; means for coupling said input signal to one of said input terminals such that the signal developed by said comparator means at said output terminal is at a level dependent upon the relative magnitudes of the signals at said two input terminals; and means for deriving a reference voltage for application to said second input terminal which changes with temperature in the same direction as said input signal, said input signal deriving means and said reference voltage deriving means each having the same number of active elements arranged such that the change in potential drops across the active elements in said input signal deriving means and the change in potential drops across the active elements in said reference voltage deriving means are approximately equal for the same change in temperature, said reference voltage deriving means includes a source of potential, and at least one diode and one resistor connected in series across said source of potential, said reference voltage deriving means further includes a transistor having a base-emitted junction connected between said second input terminal and said series-connection resistor and diode.

5. A logic circuit comprising means for deriving an input signal which varies between two discrete levels, both of which change in the same direction with a change in temperature; a switching circuit having two input terminals and at least one output terminal; means for coupling said input signal to one of said input terminals such that the signal developed by said switching circuit at said output terminal is at one of two levels dependent upon the relative magnitudes of the signals at said two input terminals; and means for deriving a reference voltage for application to said second input terminals which changes with temperature in the same direction as said two discrete input signal levels, said reference voltage deriving means includes a source of potential, and at least one diode and one resistor connected in series across said source of potential, said reference voltage deriving means further includes a transistor having a base-emitter junction connected between the said second input terminal and said series-connected resistor and diode.

6. A logic circuit in accordance with claim 5 wherein said input signal deriving means includes at least one transistor and at least one diode connected in series with the base-emitter junction of said transistor, said series-connected transistor and diode being coupled to said one input terminal, and said input signal deriving means and said reference voltage deriving means have the same number of active elements, connected respectively to said two input terminals, which affect the signal levels at said two input terminals in accordance with temperature changes.

7. A logic circuit in accordance with claim 5 wherein said switching circuit includes two transistors, each having emitter, base and collector terminals, means for interconnecting the emitter terminals of said two transistors, said base terminals being said two input terminals and one of said collector terminals being said at least one input terminal.

References Cited

UNITED STATES PATENTS

| | | | |
|---|---|---|---|
| 3,259,761 | 7/1966 | Narud et al. | 307—203 X |
| 3,439,186 | 4/1969 | Seelbach | 307—215 X |

| | | | |
|---|---|---|---|
| 3,515,899 | 6/1970 | May | 307—215 |
| 2,984,752 | 5/1961 | Giacoletto | 307—300 |
| 3,549,900 | 12/1970 | Yu | 307—215 |
| 3,522,548 | 8/1970 | Heuner et al. | 330—23 |
| 3,566,296 | 2/1971 | Liu | 330—30 D |

OTHER REFERENCES

Millman & Halkias: Electronic Devices and Circuits, pp. 130–131, 1967, McGraw-Hill, Inc.

HERMAN KARL SAALBACH, Primary Examiner

L. N, ANAGNOS, Assistant Examiner

US.S. Cl. X.R.

307—218, 297, 310; 330—23, 30 D